United States Patent
Thiruvarankan et al.

(12)

(10) Patent No.: US 10,461,407 B2
(45) Date of Patent: Oct. 29, 2019

(54) FLEXIBLE PLANAR ANTENNA FOR WIRELESS DEVICE TESTING

(71) Applicant: Keysight Technologies, Inc., Minneapolis, MN (US)

(72) Inventors: Rajaratnam Thiruvarankan, Beaverton, OR (US); Charles Edward St. John, Beaverton, OR (US)

(73) Assignee: Keysight Technologies, Inc., Santa Ross, CA (US)

( * ) Notice: Subject to any disclaimer, the term of this patent is extended or adjusted under 35 U.S.C. 154(b) by 71 days.

(21) Appl. No.: 15/799,269

(22) Filed: Oct. 31, 2017

(65) Prior Publication Data
US 2019/0131695 A1 May 2, 2019

(51) Int. Cl.
| | | |
|---|---|---|
| H01Q 1/52 | (2006.01) | |
| G01R 29/10 | (2006.01) | |
| H01Q 1/24 | (2006.01) | |
| H01Q 1/12 | (2006.01) | |
| H01Q 9/04 | (2006.01) | |
| H01Q 1/38 | (2006.01) | |

(52) U.S. Cl.
CPC ............ *H01Q 1/245* (2013.01); *G01R 29/10* (2013.01); *G01R 29/105* (2013.01); *H01Q 1/12* (2013.01); *H01Q 1/38* (2013.01); *H01Q 9/0407* (2013.01)

(58) Field of Classification Search
CPC .......... H01Q 1/526; H01Q 1/12; H01Q 1/245; H01Q 9/0407; G01R 29/105; G01R 29/0835; G01R 29/0878; G01R 29/10
See application file for complete search history.

(56) References Cited

U.S. PATENT DOCUMENTS

| | | |
|---|---|---|
| 4,134,119 A | 1/1979 | Sandoz et al. |
| 6,606,064 B1 | 8/2003 | Lusterman |
| 9,678,127 B2 | 6/2017 | Even et al. |
| 2015/0369851 A1* | 12/2015 | Even ...................... H01Q 1/526 343/703 |

OTHER PUBLICATIONS

Notice of Allowance and Fee(s) Due for U.S. Appl. No. 14/308,676 (dated Feb. 10, 2017).
Non-Final Office Action for U.S. Appl. No. 14/308,676 (dated Aug. 31, 2016).

* cited by examiner

*Primary Examiner* — Hoang V Nguyen

(57) ABSTRACT

A flexible planar antenna device and method for using the same is disclosed. In some embodiments, the flexible planar antenna device includes a planar body comprising a flexible dielectric material that enables the planar antenna device to be flexibly shapeable to a surface of a wireless device under test (DUT). The flexible planar antenna device further includes an antenna element contained within the planar body and for communicatively coupling with at least one antenna of the wireless DUT and at least one adhesive element that enables the planar body to attach to and conform to the surface of the DUT.

18 Claims, 5 Drawing Sheets

FLEXIBLE PLANAR ANTENNA FOR WIRELESS DEVICE TESTING

TECHNICAL FIELD

The subject matter described herein relates to the test and measurement of wireless data communications systems and devices. More particularly, the subject matter described herein relates to a flexible planar antenna for wireless device testing.

BACKGROUND

Wireless data communications devices, such as cellular telephones and wireless LAN transceivers, are in widespread use worldwide. There is increasing need for higher data transmission rates and the support for the ever growing number of users and data traffic. Moreover, the rapidly decreasing physical size and power consumption of mobile devices compel them to become ever more highly integrated, e.g., configured with internal antennas and fully sealed construction. All of these factors, however, increase the complexity of these wireless devices. Manufacturers, vendors and users therefore have a greater need for improved testing of such devices. Notably, the inherent complexity of wireless data communication devices makes them particularly problematic to test due to the difficulty of accessing their internally integrated antennas, isolating the wireless devices from external interference, and controlling the coupling between the wireless device and the test equipment. For example, actual open-air radio frequency (RF) environments contain high levels of uncontrollable noise and interference, which have significant impact on device performance. The lack of controllability and test repeatability also makes it difficult or impossible to automate the testing of such wireless devices. Consequently, there is great appeal for manufacturers and users to be able to test these devices in a repeatable fashion that excludes the interference and variability of real RF environments and also controls the degree of wireless coupling between the wireless device and the test equipment device. This also enables the tests to be conducted in an automated fashion, or by personnel not highly skilled in RF channel characteristics.

Some methods of isolating and coupling to wireless communications devices include the use of anechoic and reverberation chambers, shielded enclosures of various sizes, cabled connections to device antenna connectors or antennas, the utilization of antenna ranges, and/or the DUT operation in open air environments. All of these methods exhibit one or more deficiencies when considering the requirements of modern wireless devices. Anechoic and reverberation chambers are very expensive, bulky and fixed at one location due to their large size and weight. Shielded enclosures offer limited portability but are still relatively expensive and heavy, and suffer from repeatability issues. Further, small shielded enclosures present many problems when dealing with wireless device systems. Tests involving cabled connections to the wireless DUT are simple and offer very high repeatability and low cost, but are unfortunately impractical or impossible with modern highly integrated compact devices such as cellular telephones. Outdoor antenna ranges are expensive and difficult to find, due to their real estate requirements, and further have problems when dealing with wireless transmission. Open air environments are highly variable, nearly impossible to reproduce, and present significant challenges with repeatability and controllability.

Accordingly, there is a need for a flexible planar antenna device for wireless device testing.

SUMMARY

A flexible planar antenna device and method for using the same are disclosed. In some embodiments, the flexible planar antenna device includes a planar body comprising a flexible dielectric material that enables the planar antenna device to be flexibly shapeable to a surface of a wireless device under test (DUT). The flexible planar antenna device further includes an antenna element contained within the planar body used for communicatively coupling with at least one antenna of the wireless DUT, and at least one adhesive element that enables the planar body to attach to and conform to the surface of the DUT.

In some embodiments, the method includes connecting test equipment to a connector on a flexible planar body of a flexible planar antenna device that includes an antenna element. The method also includes shaping the flexible planar body about a surface of a DUT such that at least one adhesive element of the flexible planar body enables the flexible planar body to come in contact with and remain attached to the surface of the DUT. The method further includes wirelessly transmitting data between an antenna element included in the flexible planar antenna device and at least one antenna in the DUT.

BRIEF DESCRIPTION OF THE DRAWINGS

The subject matter described herein will now be explained with reference to the accompanying drawings of which.

DETAILED DESCRIPTION

The subject matter described herein includes a flexible planar antenna device for wireless device testing. In particular, the flexible planar antenna device may be positioned on and attached to a DUT such that the internal RF components of a DUT are in close proximity to an antenna element of the flexible planar antenna device. Notably, the flexible planar antenna device may be placed in full contact with the surface of the DUT, thereby enabling RF components to communicate with a testing device with little signal loss. Such positioning in testing situations significantly reduces signal power loss and attenuation, which can ultimately contribute to an inaccurate characterization of the DUT. More specifically, regular antennas, like dipole antennas, can be used by test equipment to test wireless devices under test in a controlled electromagnetic test environment.

However, these types of antennas do not receive sufficient signal power from a device under test since the antennas are far away from the device under test. In particular, if a testing device antenna cannot receive sufficient signal power from a device under test, the testing device will be unable to accurately characterize the device under test. As such, the application of the flexible planar antenna device to the surface of the DUT serves to decrease signal power loss. The disclosed subject matter affords a testing device that is inexpensive and extremely lightweight and portable as compared to systems that require anechoic chambers or shielded enclosures. Further, the disclosed subject matter is still able to offer the benefits of enhanced RF isolation and consistent and repeatable signal coupling with a DUT antenna. In particular, it may be apparent that this system can be used without special setup or infrastructure requirements. In addition, the attachment means also allows the antenna device to be easily reapplied and repositioned, thereby increasing its reusability.

Reference will now be made in detail to various embodiments of the subject matter described herein, examples of which are illustrated in the accompanying drawings. Wherever possible, the same reference numbers will be used throughout the drawings to refer to the same or like parts.

Figure 1:
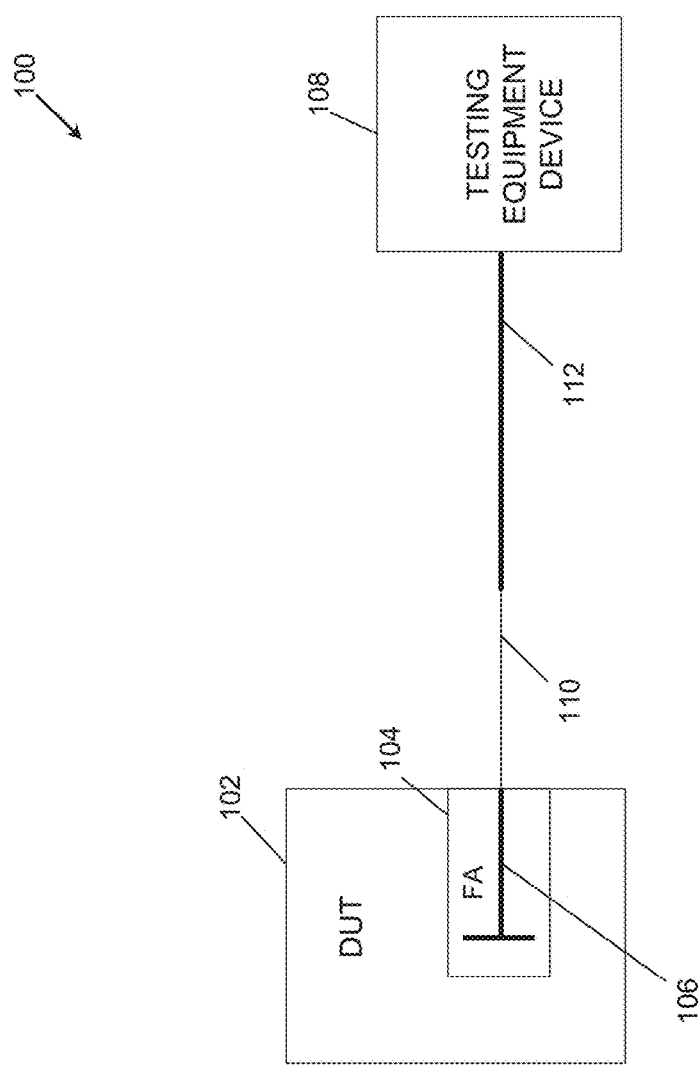
FIG. 1 is a block diagram illustrating an exemplary test system including a flexible planar antenna for wireless device testing in accordance to an embodiment of the subject matter described herein.

FIG. 1 illustrates a wireless device test system 100 that includes a wireless device under test (DUT) 102, flexible planar antenna device 104, and a test equipment device 108. In some embodiments, test equipment device 108 may be connected to flexible planar antenna device 104 via the connection of flexible radio frequency (RF) cable 110 and test equipment cable 112. In some embodiments, both flexible RF cable 110 and test equipment cable 112 may comprise coaxial cables that are configured to transport RF data signals and are coupled together via a cable connection (e.g., a SMA connection). Flexible planar antenna device 104 may also include a flexible antenna element 106 that is connected to flexible RF cable 110. Notably, test equipment device 108 is configured to exchange RF data signals with DUT 102 by way of the wireless electromagnetic coupling between antenna element 106 and the antenna(s) of DUT 102. In some embodiments, wireless device test system 100 is configured in a manner such that flexible antenna element 106 only functions as a receiving antenna (i.e., flexible planar antenna device 104 is adapted to only receive wireless communications from DUT 102). In such embodiments, flexible planar antenna device 104 is further configured to only provide the signal data received from the DUT 104 to test equipment device 108 (i.e., test equipment device 108 does not provide any signal data to DUT 102 via flexible planar antenna device 104).

In some embodiments, antenna element 106 is a flexible antenna integrated within flexible planar antenna device 104. In some embodiments, antenna element 106 is a copper trace element that is sufficiently thin to flex along with the planar body of flexible planar antenna device 104. As used herein, the term planar body refers to the flat structural portion of flexible planar antenna device 104 that is connected to flexible RF cable 110. In some embodiments, the trace layout of antenna element 106 supports transmission of data in two separate frequency bands, i.e., the 2.4 Ghz-2.5 Ghz frequency band and the 4.9 Ghz-6.0 Ghz frequency band. Notably, flexible planar antenna device 104 is able to receive a signal transmission from DUT 102 in these two frequency bands without requiring a separate physical antenna for each band.

Antenna element 106 is configured to wirelessly communicate radio frequency (RF) signals to and from at least one antenna belonging to DUT 102. In some embodiments, flexible planar antenna device 104 is secured to wireless DUT 102 via one or more temporary attachment elements. As will be discussed in greater detail below, flexible planar antenna device 104 may be attached to DUT with temporarily adhesive elements (e.g., adhesive elements 404 shown in FIG. 4) such as adhesive strips, adhesive tape, or the like. Using this manner of attachment, flexible planar antenna device 104 may be placed in contact with the surface of DUT 102, which may include a casing or surface that is angular, curved, or otherwise irregularly shaped. In some embodiments, the flexible planar antenna device 104 is notably placed in immediate or direct contact with the surface of DUT 102, e.g., without the use of any spacers. Further, the adhesive elements permit that the flexible planar antenna device 104 may be placed on a metal surface of DUT 102. Further, attachment of flexible planar antenna device 104 on a metal surface of DUT 102 will not detune flexible planar antenna device 104, e.g., when receiving signals from DUT 102. Notably, the planar body of flexible planar antenna device 104 is sufficiently flexible such that flexible planar antenna device 104 can be placed in full contact with the DUT despite any irregular surface and/or contours of the DUT. Specifically, the disclosed attachment methodology attempts to achieve the closest coupling between the flexible planar antenna and the DUT antenna as possible. In some embodiments, this can be accomplished by positioning flexible planar antenna device 104 in a range of allowable positions over the outer surface of DUT 102. This positioning can include movement in the x-axis and the y-axis with reference to the DUT transmitting antenna. In particular, the planar body of flexible planar antenna device 104 may be shaped in such a manner that it is folded over and/or around the DUT (e.g., so that antenna element 106 is placed in the closest proximity to the antenna in DUT 104 as possible). This is advantageous since there are instances when the exact positioning of an internal antenna within a DUT is unknown. As such, the flexibility, shapeability, and repositionability of the flexible planar antenna device 104 increase the probability that antenna element 106 is positioned in close proximity to an internal antenna of DUT 106. Once flexible planar antenna device 104 is attached to DUT 102, antenna element 106 is configured to receive RF signal data from the antenna of DUT 102. Flexible planar antenna device 104 may then forward the received signal data to test equipment device 108 via flexible RF cable 110. Using the received signal data, test equipment device 108 then provides feedback information to the user to allow for optimal placement and positioning of the flexible planar antenna device 104 and/or to accurately characterize the transmission capabilities of DUT 102.

Additional benefits are gained by attaching the flexible planar antenna device 104 to the DUT 102 in this manner. By positioning a single antenna element 106 of flexible planar antenna device 104 in close proximity to an antenna (e.g., an internal antenna) included in DUT 102, wireless communication between flexible planar antenna device 104 and DUT 102 can be isolated from external RF interference. In particular, the close proximity of the two antennas enables flexible planar antenna device 104 to receive a greater amount of signal power transmitted from DUT 102. In some other testing environments, a device under test can be wrapped using a 'blanket' consisting of an antenna array. However, the antennas cannot be placed in close proximity to the transmitting antenna on the device under test. Notably, path loss of the electromagnetic signal is experienced when the antenna of the device under test and the antenna of the test device are separated. Furthermore, because an antenna array utilizes multiple antennas to obtain the resultant signal power generated by the device under test, the phase difference between the multiple receiving antennas will also result in a reduction of detected signal power. Utilizing a single antenna element as provided by the disclosed subject matter eliminates any signal power loss due to phase differentials of the detected signals. Accordingly, the DUT is more accurately characterized by test equipment device 108.

Further, by receiving more signal power from DUT 102 in this manner, flexible planar antenna device 104 is able to provide more accurate signal data to test equipment device 108 via flexible RF cable 110. Test equipment device 108 is then able to process the signal data received from flexible planar antenna device 104 to assess and characterize the transmission quality and/or capabilities of DUT 102. In some embodiments, test equipment device 108 may include a spectrum analyzer or any other test or measurement device that measures and/or analyzes the received RF signals from DUT 102.

Figure 2:
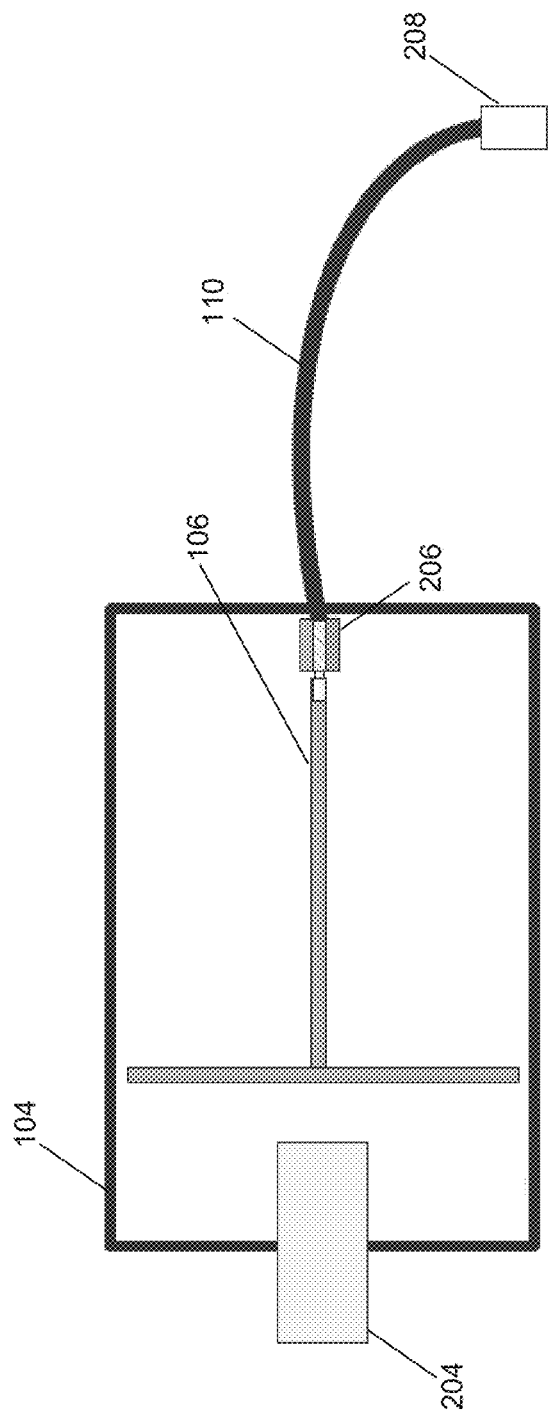
FIG. 2 is a plan view of a flexible planar antenna for wireless device testing in accordance to an embodiment of the subject matter described herein.

FIG. 2 is a plan view of a flexible planar antenna device 104 for wireless device testing in accordance to an embodiment of the subject matter described herein. As shown in FIG. 2, antenna element 106 is integrated into flexible planar antenna device 104. In some embodiments, antenna element 106 may comprise a copper trace embedded in a printed circuit board (PCB). Antenna element 106 is also securely connected to cable connector 206 of flexible RF cable 110. For example, flexible RF cable 110 may be attached to one terminal end of antenna element 106 via soldering at cable connector 206. Further, a drop of epoxy or other adhesive substance may be used to support the connection between a cable connector 206 and antenna element 106. Notably, antenna element 106 may be connected to cable connector 206 in any manner that provides an electromagnetic communication path between antenna element 106 and flexible RF cable 110. The communication path enables the communication of RF data signals received by antenna element 106 to be provided to test equipment devices. The communication path also facilitates the receiving of data signals provided to antenna element 106 (for delivery to DUT 102) by a connected test equipment device (e.g., test equipment device 108 shown in FIG. 1).

In some embodiments, flexible planar antenna device 104 and a test equipment device are coupled via one or more flexible RF communication cables (e.g., coaxial cable(s) connected via a SMA connection). For example, the unattached end of flexible RF cable 110 is terminated with cable connector 208, which may include a female SMA connector that allows attachment to a testing and/or measuring instrument device (e.g., test equipment device 108 in FIG. 1). Specifically, cable connector 208 of flexible RF cable 110 may be connected to a communication cable (or, alternatively, a device port) of an external test equipment device. The test equipment device can then exchange RF signals with DUT 102 as antenna element 106 is electromagnetically and wirelessly coupled to the antenna(s) of DUT 102. The close proximity and positioning of antenna element 106 to the DUT antenna(s) significantly improves the efficiency of the wireless coupling (e.g., wireless communication signal path) due in large part to a significant reduction in the amount of external interference.

Figure 3:
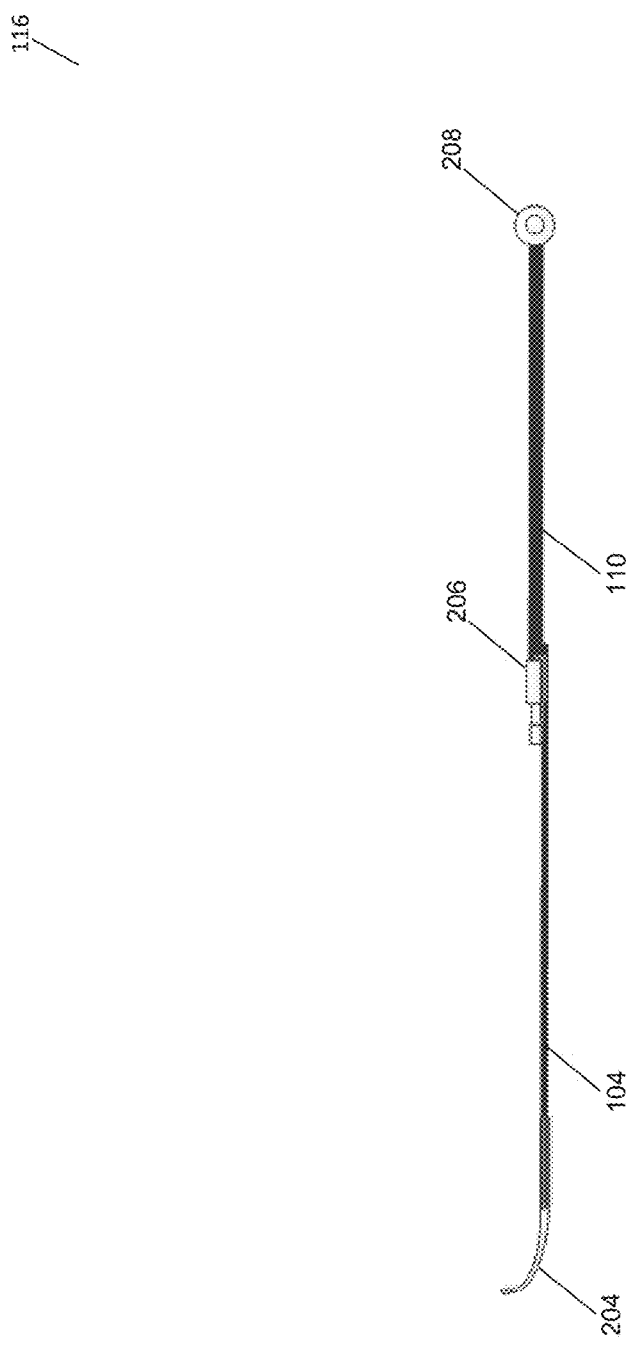
FIG. 3 is a profile view of flexible planar antenna for wireless device testing in accordance to an embodiment of the subject matter described herein.
Figure 4:
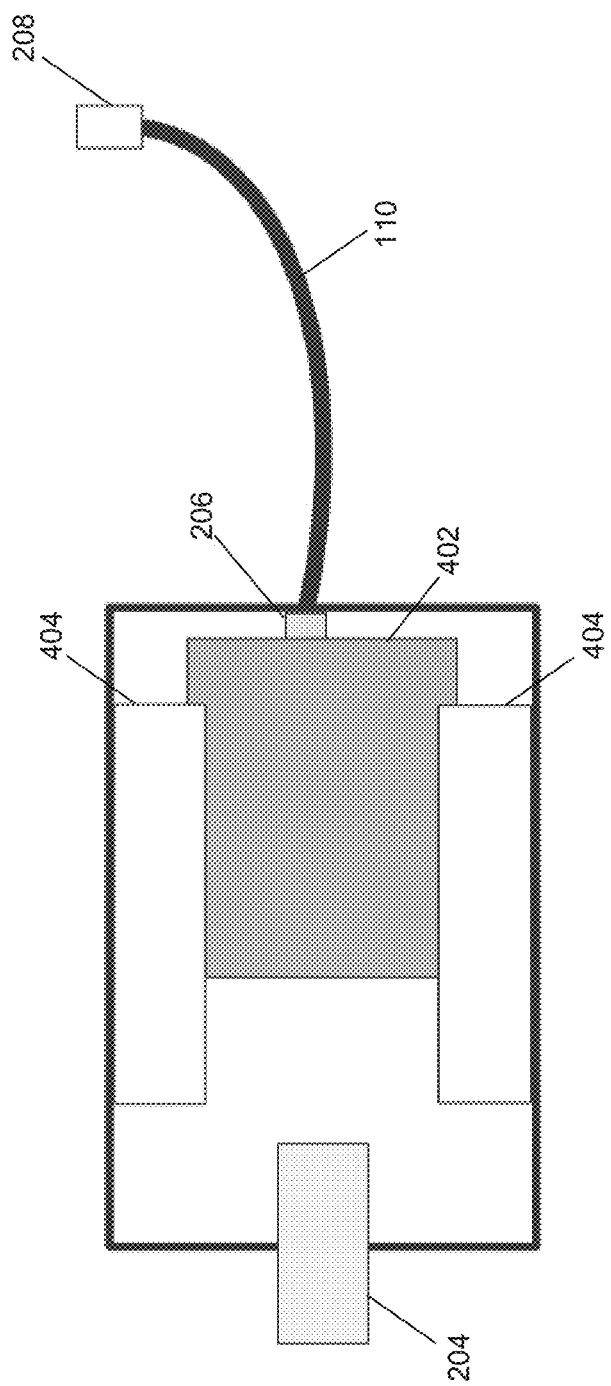
FIG. 4 is a bottom view of flexible planar antenna for wireless device testing in accordance to an embodiment of the subject matter described herein.

FIG. 2 further depicts a pull tab loop element 204 that is connected to the top side of the planar body of flexible planar antenna device 104. Pull tab loop element 204 is additionally connected to the bottom side of flexible planar antenna device 104 (as shown in FIGS. 3 and 4). Notably, pull tab loop element may be used to peel or remove flexible planar antenna device 104 from a DUT (as described in greater detail below).

FIG. 3 depicts a side view of a flexible planar antenna device in accordance to an embodiment of the subject matter described herein. FIG. 3 in particular illustrates that flexible planar antenna device 104 has a significantly thin profile and/or thickness which enables flexible planar antenna device 104 to be shaped in a manner that accommodates the attachment of the planar body of flexible planar antenna device 104 to an irregular or contoured surface of a DUT. In some embodiments, flexible planar antenna device 104 may comprise a flexible multilayered printed circuit board (PCB). In some embodiments, one exemplary layer stackup of flexible planar antenna device 104 may comprise:

| Layer Thickness | Dk | Material |
| --- | --- | --- |
| 25 μm | 3.6 | Polyimide |
| 35 μm | 3.8 | Adhesive |
| 18 μm | Cu | |
| 25 μm | 3.8 | Adhesive |
| 50 μm | 3.5 | Polyimide Pyralux AP DuPont FR8525R |
| 25 μm | 3.8 | Adhesive |
| 18 μm | Cu | |
| 35 μm | 3.8 | Adhesive |
| 25 μm | 3.6 | Polyimide |

Notably, the thickness of the various layers of the multilayered flexible planar antenna device 104 are indicated in micrometers (μm). In some embodiments, the thickness of flexible planar antenna device 104 therefore does not exceed 0.256 millimeters, thereby permitting flexible planar antenna device 104 to be bent or folded for attachment to any surface. Further, "Dk" represents a dielectric constant value that corresponds to each of the corresponding layers. Such a multilayer PCB readily affords a planar antenna device the necessary flexibility to bend and shape in a manner that can conform to and/or with the irregular surfaces and contours of a DUT. In some embodiments, the PCB planar body of the flexible planar antenna device may have a bend radius of one inch. Although the above values represent an example multilayered flexible planar antenna device, it is understood that other layers may be added or removed without departing from the scope of the disclosed subject matter. For example, one flexible planar antenna device may comprise both a first layer (e.g., a first copper layer for antenna element) and the second layer (e.g., a second copper layer for ground element) that may be separated by a flexible dielectric layer (e.g., Polyimide Pyralux layer). In some embodiments, the thickness and/or geometries of the aforementioned layers may be defined such that the characteristic impedance of flexible RF cable 110 matches the characteristic impedance of antenna element 106 on flexible planar antenna device 104.

In addition, as illustrated in FIG. 3, pull tab loop element 204 is shown to be connected to both the top side and bottom side of flexible planar antenna device 104. In particular, a pull tab loop element 204 may be grasped by a user and subsequently used to pull a flexible planar antenna device 104 (that is attached or adhered to the surface(s) of a DUT) away from the attached DUT as described below and in FIG. 4.

FIG. 4 is a bottom view of flexible planar antenna for wireless device testing in accordance to an embodiment of the subject matter described herein. As shown in FIG. 4, flexible planar antenna device 104 includes the ground region element 402. In some embodiments, ground region element 402 may comprise a copper PCB trace that is sufficiently thin to flex with the planar body of flexible planar antenna device 104. Further, FIG. 4 depicts an example positioning of adhesive elements 404 on the bottom side of flexible planar antenna device 104.

In some embodiments, adhesive elements 404 may comprise any temporary adhesive means that includes, but not limited to, adhesive strips, adhesive tape, or the like. By using this manner of attachment, flexible planar antenna device 104 may be placed in contact with the surface of DUT 102 and temporarily secured in the desired adhered position. After flexible planar antenna device 104 is attached to DUT 102 and held securely with adhesive strips (see, e.g., adhesive elements 404 in FIG. 4), flexible planar antenna device 104 remains in a fixed position. As a consequence, the attachment or coupling between DUT 102 and flexible planar antenna device 104 is held constant.

In some embodiments, adhesive elements 404 may include attachment strips that are protected with a covering or liner that can be removed at the time flexible planar antenna device 104 is positioned and attached to the surface of the DUT. In some examples, the adhesive quality of adhesive elements 404 may be such that several attachments and removals (e.g., attach/remove cycles) are possible without significantly affecting the adhesive elements' ability to adhere to the surface of the DUT. Further, the adhesive strips in combination with the flexible planar body of flexible planar antenna device 104 enables flexible planar antenna device 104 to be flexibly shaped about the DUT such that flexible planar antenna device 104 can accommodate and conform to the contours and/or irregular surface shape of a DUT.

FIG. 4 further depicts the underside of pull tab loop element 204 as being connected underneath flexible planar antenna device 104. Notably, pull tab loop element 204 is adhered and/or attached to each of the bottom layer/side (as shown in FIG. 4) and the top layer/side (as shown in FIG. 2) of flexible planar antenna device 104 and allows a user to peel and/or remove an attached flexible planar antenna device 104 from the surface of a DUT. Notably, pull tab loop element 204 helps guide a user to remove flexible planar antenna device 104 without tearing for ripping the thin planar body of flexible planar antenna device 104. In addition, the presence of pull tab loop element 204 also decreases the probability that flexible planar antenna device 104 is removed from the DUT by pulling on flexible RF cable 110, thereby preventing resultant damage to RF flexible cable 110 and/or the attachment site (e.g., cable connector 208) Both the pull tab loop element and the temporary adherence of the adhesive means enables the flexible planar antenna device 104 to be reused for the repeated application to a number of DUTs to be tested.

Figure 5:
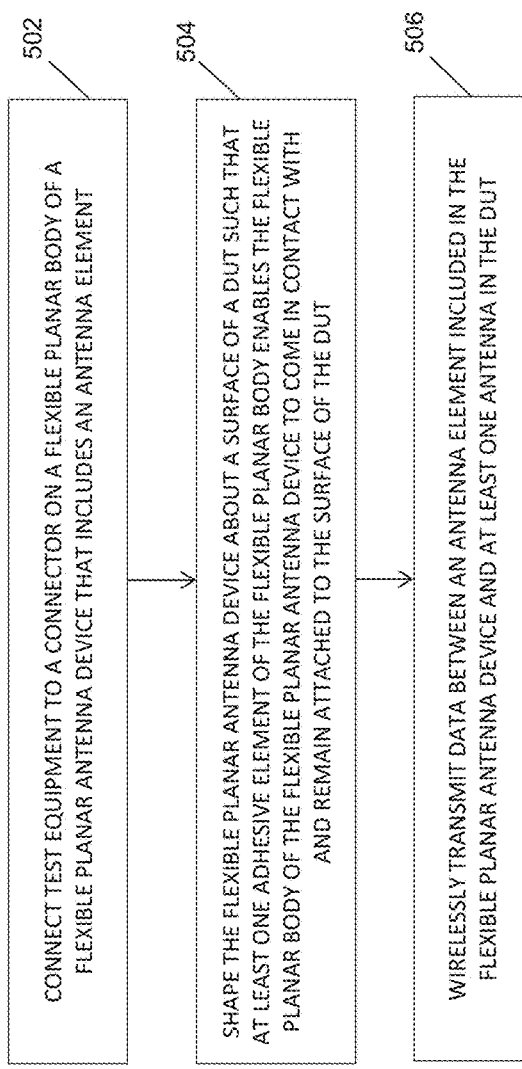
FIG. 5 depicts a flow chart illustrating an example method for utilizing a flexible planar antenna for wireless device testing in accordance to an embodiment of the subject matter described herein.

FIG. 5 depicts an example method for utilizing a flexible planar antenna device for wireless device testing in accordance to an embodiment of the subject matter described herein. For example, referring to method 500, in block 502, a test equipment device is connected via RF flexible cables to a flexible planar antenna device that includes an antenna element. In some embodiments, the flexible planar antenna device includes a coaxial cable that is terminated with an SMA connector. Notably, the SMA connector may be used to attach to a corresponding SMA connector terminated on a cable connector or port associated with a test equipment device, such as a spectrum analyzer. The test equipment device may receive RF signals from (or send test RF signal data to) the flexible planar antenna device via the SMA connection.

In block 504, the flexible planar antenna device is shaped about a surface of a DUT such that at least one adhesive element of the flexible planar body enables the flexible planar body of the flexible planar antenna device to come in contact with and remain attached to the surface of the DUT. In some embodiments, a protective liner protecting/covering at least one attachment tape positioned and/or attached on the bottom side of the flexible planar antenna device is removed, thereby exposing an adhesive surface of the at least one attachment tape. In some embodiments, the flexible planar antenna device is shaped around and/or on a DUT (e.g., a wireless mobile device) such that the flexible planar antenna device is positioned on and/or around the surface of the DUT. Notably, the attachment tape enables the flexible planar antenna device to conform and/or remain in contact with the surface of the DUT and the flexible characteristic of the attached planar antenna device permits the planar antenna device to accommodate and/or conform the irregular contours and shape of the DUT (e.g., conform, encircle and/or wrap around at least a portion of the DUT). It is understood that block 502 (i.e., attachment of connection cables) and block 504 (attachment of planar antenna device to DUT via adhesive means) may be performed in any order without departing from the scope of the disclosed subject matter.

In block 506, signal data is wirelessly transmitted between an antenna element included in the flexible planar antenna device and at least one antenna in the DUT. In some embodiments, signal data is wirelessly transmitted from the antenna of DUT to the antenna element of the flexible planar antenna device. Notably, the signal power received from the DUT is high due to the close proximity and positioning of the two device antennas. In particular, signal interference that compromises and/or attenuates signal power from the DUT is reduced due to the attachment of the flexible planar antenna device to the surface of the DUT. In some embodiments, signal data (e.g., test data originating from the test equipment) is also wirelessly transmitted from antenna element of the flexible planar antenna device to the antenna of DUT. For the same reasons described above, very little signal power of the communicated data is attenuated. In some embodiments, the antenna element included in the flexible planar device functions only as a receiving antenna (i.e., only receives signal data from the DUT).

In some embodiments, the planar body of the flexible planar antenna device has a one inch bend radius.

In some embodiments, the planar body of the flexible planar antenna device comprises a multilayer printed circuit board (PCB).

In some embodiments, the flexible planar antenna device comprises a first layer of the multilayer PCB that includes the antenna element and a second layer of the multilayer PCB that includes a ground region element.

In some embodiments, the first layer and the second layer of the multilayer PCB of the flexible planar antenna device are separated by a dielectric layer.

In some embodiments, the flexible planar antenna device is further configured to include a pull tab loop element that enables removal of the planar body from the surface of the DUT.

In some embodiments, the pull tab loop element of the flexible planar antenna device is attached to both a top side and bottom side of the planar body.

In some embodiments, the flexible planar antenna device includes a antenna element that comprises a copper trace.

In some embodiments, the flexible planar antenna device includes at least one adhesive element that includes an adhesive strip or adhesive tape.

In some embodiments, the communicatively coupling between the at least one antenna of the DUT and the antenna element of the flexible planar antenna device facilitates a wireless electromagnetic connection that facilitates the wireless communication of radio frequency (RF) data signals.

It will be understood that various details of the subject matter described herein may be changed without departing from the scope of the subject matter described herein. Furthermore, the foregoing description is for the purpose of illustration only, and not for the purpose of limitation.

What is claimed is:

1. A flexible planar antenna device comprising:
a planar body comprising a flexible dielectric material that enables the flexible planar antenna device to be flexibly shapeable to a surface of a wireless device under test (DUT);
an antenna element contained within the planar body and for electromagnetically coupling with at least one antenna of the wireless DUT; and
at least one adhesive element that enables the planar body to attach to and conform to the surface of the DUT, wherein the flexible planar antenna device is further configured to include a pull tab loop element that enables removal of the planar body from the surface of the DUT.

2. The flexible planar antenna device of claim 1 wherein the planar body has a one inch bend radius.

3. The flexible planar antenna device of claim 1 wherein the planar body comprises a multilayer printed circuit board (PCB).

4. The flexible planar antenna device of claim 3 wherein a first layer of the multilayer PCB includes the antenna element and a second layer of the multilayer PCB includes a ground region element.

5. The flexible planar antenna device of claim 4 wherein the first layer and the second layer of the multilayer PCB are separated by a dielectric layer.

6. The flexible planar antenna device of claim 1 wherein the pull tab loop element is attached to both a top side and bottom side of the planar body.

7. The flexible planar antenna device of claim 1 wherein the antenna element comprises a copper trace.

8. The flexible planar antenna device of claim 1 wherein the at least one adhesive element includes an adhesive strip or adhesive tape.

9. The flexible planar antenna device of claim 1 wherein the electromagnetic coupling between the at least one antenna of the DUT and the antenna element facilitates a wireless electromagnetic connection that facilitates a wireless communication of radio frequency (RF) data signals.

10. A method comprising:
connecting test equipment to a connector on a flexible planar body of a flexible planar antenna device that includes an antenna element;
shaping the flexible planar antenna device about a surface of a device under test (DUT) such that at least one adhesive element of the flexible planar body enables the flexible planar body of the flexible planar antenna device to come in contact with and remain attached to the surface of the DUT; and
wirelessly transmitting data between an antenna element included in the flexible planar antenna device and at least one antenna in the DUT, wherein the flexible planar antenna is further configured to include a pull tab loop element that enables removal of the planar body from the surface of the DUT.

11. The method of claim 10 wherein the planar body has a one inch bend radius.

12. The method of claim 10 wherein the planar body comprises a multilayer printed circuit board (PCB).

13. The method of claim 12 wherein a first layer of the multilayer PCB includes the antenna element and a second layer of the multilayer PCB includes a ground region element.

14. The method of claim 13 wherein the first layer and the second layer of the multilayer PCB are separated by a dielectric layer.

15. The method of claim 10 wherein the pull tab loop element is attached to both a top side and bottom side of the planar body.

16. The method of claim 10 wherein the antenna element comprises a copper trace.

17. The method of claim 10 wherein the at least one adhesive element includes an adhesive strip or adhesive tape.

18. The method of claim 10 wherein wirelessly transmitting data includes a wireless communication of radio frequency (RF) data signals.

* * * * *